(12) United States Patent
Kolev et al.

(10) Patent No.: US 9,115,755 B2
(45) Date of Patent: Aug. 25, 2015

(54) CURRENT INSULATED BEARING COMPONENTS AND BEARINGS

(71) Applicant: Picosun Oy, Espoo (FI)

(72) Inventors: Ivan Kolev, Maastricht (NL); Paul Peeters, Eindhoven (NL); Roland Tap, Nürnberg (DE); Bertram Haag, Uhlfeld (DE); Yashar Musayev, Nürnberg (DE); Serge Kursawe, Uttenreuth (DE); Tim Matthias Hosenfeldt, Nürnberg (DE); Jürgen Gierl, Erlangen (DE); Juhana Kostamo, Espoo (FI)

(73) Assignee: Picosun OY, Espoo (FI)

( * ) Notice: Subject to any disclaimer, the term of this patent is extended or adjusted under 35 U.S.C. 154(b) by 91 days.

(21) Appl. No.: 13/728,895

(22) Filed: Dec. 27, 2012

(65) Prior Publication Data

US 2013/0209006 A1 Aug. 15, 2013

(30) Foreign Application Priority Data

Feb. 15, 2012 (EP) .................................. 12000975

(51) Int. Cl.
*C23C 16/50* (2006.01)
*F16C 33/02* (2006.01)
(Continued)

(52) U.S. Cl.
CPC ............ *F16C 33/02* (2013.01); *C23C 16/45546* (2013.01); *C23C 16/45555* (2013.01);
(Continued)

(58) Field of Classification Search
USPC .......... 384/445, 492, 912; 428/216, 336, 408, 428/472, 701, 702
See application file for complete search history.

(56) References Cited

U.S. PATENT DOCUMENTS

| 5,067,826 A | 11/1991 | Lemelson |
| 5,593,234 A * | 1/1997 | Liston ........................ 384/492 |

(Continued)

FOREIGN PATENT DOCUMENTS

| DE | 19631988 A1 | 2/1998 |
| DE | 102007035342 A1 | 1/2009 |

(Continued)

OTHER PUBLICATIONS

Chowdhury, A., et al.; "Alumina as a Hydrogen Barrier Layer for FeRAM Devices"; IEEE Conference: Non-Volatile Memory Technology Symposium, NVMTS '07; (Nov. 10-13, 2007); pp. 49-52.
(Continued)

*Primary Examiner* — Archene Turner
(74) *Attorney, Agent, or Firm* — Ziegler IP Law Group, LLC

(57) ABSTRACT

Disclosed is a bearing component having at least one layer having a high hardness and a high current insulation property, the layer comprising a nonconductive oxide layer selected from the group comprising an $Al_2O_3$ layer, a TaO layer, an $SiO_2$ layer, a mixed layer comprising two or more of the foregoing oxides, a multilayer structure comprising alternating layers of two or more of the foregoing oxides and a DLC layer such as a ta-C layer, there being at least one ALD layer comprising at least one layer of a material deposited by an ALD (atomic layer deposition) process on the at least one layer having a high hardness and a high current insulation property, the ALD layer itself having a high current insulation property and comprising a material or layer structure selected from the said group of materials.

13 Claims, 7 Drawing Sheets

Figure 1:
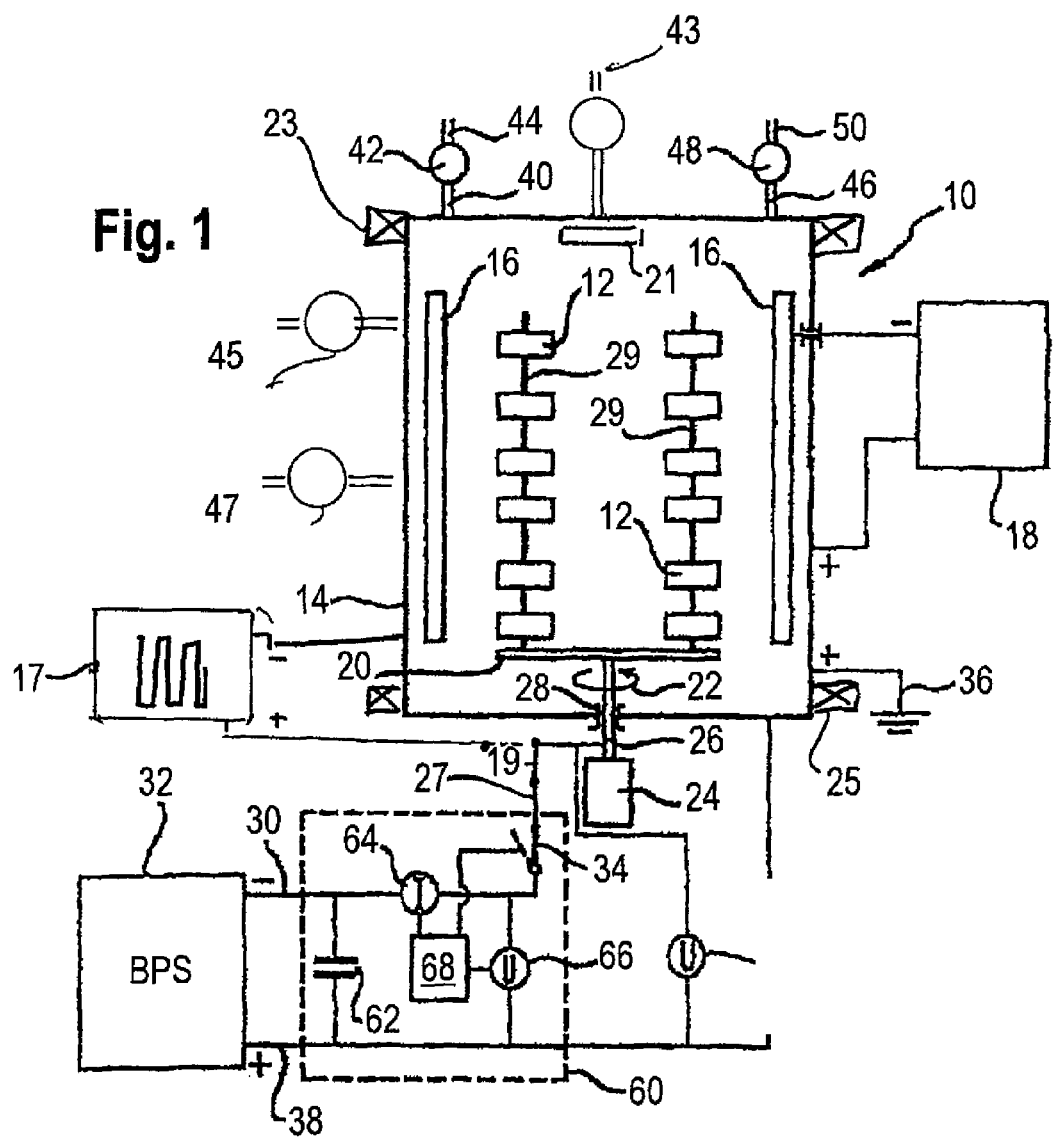

(51) Int. Cl.
  *F16C 33/38* (2006.01)
  *F16C 33/62* (2006.01)
  *F16C 33/46* (2006.01)
  *F16C 33/64* (2006.01)
  *C23C 16/455* (2006.01)
  *F16C 41/00* (2006.01)
  *F16C 33/32* (2006.01)
  *F16C 33/34* (2006.01)
  *F16C 33/04* (2006.01)
  *F16C 33/44* (2006.01)
  *F16C 33/56* (2006.01)

(52) U.S. Cl.
  CPC ............... *C23C16/50* (2013.01); *F16C 33/38* (2013.01); *F16C 33/46* (2013.01); *F16C 33/62* (2013.01); *F16C 33/64* (2013.01); *F16C 41/008* (2013.01); *F16C 33/043* (2013.01); *F16C 33/32* (2013.01); *F16C 33/34* (2013.01); *F16C 33/445* (2013.01); *F16C 33/565* (2013.01); *F16C 2202/30* (2013.01); *F16C 2206/04* (2013.01); *F16C 2206/44* (2013.01); *F16C 2223/60* (2013.01); *F16C 2240/60* (2013.01); *F16C 2240/64* (2013.01); *F16C 2380/26* (2013.01)

(56) References Cited

U.S. PATENT DOCUMENTS

| | | | | |
|---|---|---|---|---|
| 5,961,218 | A * | 10/1999 | Nagasaka et al. | 384/912 |
| 6,357,923 | B1 * | 3/2002 | Sato et al. | 384/492 |
| 6,471,410 | B1 * | 10/2002 | Jacobson et al. | 384/492 |
| 6,688,769 | B2 * | 2/2004 | Takayanagi et al. | 384/276 |
| 6,740,393 | B1 | 5/2004 | Massler et al. | |
| 6,869,676 | B2 * | 3/2005 | Burger et al. | 428/336 |
| 6,935,618 | B2 * | 8/2005 | Welty et al. | 428/408 |
| 2001/0054769 | A1 | 12/2001 | Raaijmakers et al. | |
| 2003/0219979 | A1 | 11/2003 | Choi et al. | |
| 2004/0023461 | A1 | 2/2004 | Ahn et al. | |
| 2005/0106865 | A1 | 5/2005 | Chung et al. | |
| 2005/0158590 | A1 | 7/2005 | Li | |
| 2006/0125850 | A1 | 6/2006 | Kim et al. | |
| 2007/0116872 | A1 | 5/2007 | Li et al. | |
| 2007/0116888 | A1 | 5/2007 | Faguet | |
| 2007/0116921 | A1 | 5/2007 | Berselli et al. | |
| 2007/0283886 | A1 | 12/2007 | Chung et al. | |
| 2008/0073127 | A1 | 3/2008 | Zhan et al. | |

FOREIGN PATENT DOCUMENTS

| | | | |
|---|---|---|---|
| GB | 2455993 | * | 7/2009 |
| GB | 2455993 B | | 9/2012 |
| JP | 2005-032346 | * | 2/2005 |
| WO | 0227065 A1 | | 4/2002 |
| WO | 2010026092 A3 | | 3/2010 |
| WO | 2010/139855 | * | 12/2010 |
| WO | 2010139855 A1 | | 12/2010 |

OTHER PUBLICATIONS

Lisoni, J. G., et al.; "Enhanced oxidation of TiAlN barriers integrated in three-dimensional ferroelectric capacitor structures"; Journal of Applied Physics; vol. 101, No. 1; (Jan. 2007); pp. 014908-014908-7.

Marin, E., et al.; "Chemical and electrochemical characterization of hybrid PVD + ALD hard coatings on tool steel"; Electrochemistry Communications; vol. 11, No. 10; (Oct. 2009); pp. 2060-2063.

Marin, Elia, et al.; "Atomic layer deposition: state-of-the-art and research/industrial perspectives"; Corrosion Reviews; vol. 29, No. 5-6; (Oct. 13, 2011); pp. 191-208.

Ritala, Mikko, et al.; "Atomic Layer Deposition"; Handbook of Thin Film Materials; H. S. Nalwa, ed.; Academic Press; (San Diego, CA, 2002); vol. 1; pp. 103-159.

Shan, C.X., et al.; "Improvement in corrosion resistance of CrN coated stainless steel by conformal TiO2 deposition"; Surface & Coatings Technology; vol. 202, No. 10; (Feb. 15, 2008); pp. 2147-2151.

Extended European Search Report issued on Jul. 25, 2012, in European Application No. 12000975.8 filed Feb. 15, 2012, 4 pages.

* cited by examiner

CURRENT INSULATED BEARING COMPONENTS AND BEARINGS

This application claims priority to European Application No. 12000975.8, filed Feb. 15, 2012, the disclosure of which is incorporated by reference herein.

The present invention relates to current insulated bearing components and bearings.

Rolling element bearings are used in many industrial applications, such as in diverse machines, in wheel sets and traction motors of rail vehicles, in DC and electric motors used in drive trains and in generators, such as those driven by wind power.

Such rolling bearings can be exposed to electrical current. In a worst case scenario this can damage raceways and rolling elements, which in turn causes the motor or generator to fail prematurely and without warning. On top of the extra expenses incurred for repairs, this also means additional costs caused by machine downtime and the resulting production losses.

A much more economical solution is to provide for the use of current insulated bearings in the products concerned. This reduces the maintenance and repair costs and increases machine availability. These are all important issues for the customer.

In some cases it is sufficient to interrupt the electric circuit between the bearing housing and the associated shaft and to install current insulated bearings at one or more bearing locations between the housing of the apparatus and the shaft, depending on the application.

Current insulated bearings, which are frequently ceramic coated, give a significantly higher resistance to electrical current than standard bearings.

Generally speaking it is very difficult to eliminate the causes of bearing voltages that are induced by the electric motor. I.e., more generally stated, to eliminate currents taking undesired paths, such currents being related to the energy supply of the electrical device concerned. Nevertheless, it is possible to avoid damage to the bearing if the flow of current can either be prevented or at least significantly reduced. Many types of current insulated rolling bearings are available today. The type of components which need to be insulated depends on the type of voltages involved and the particular application or installation.

An induced voltage extending along the shaft of the rotor of the electric motor or generator produces a circular current which is closed via the bearings which support the shaft and the housing extending between them. Such shaft voltages are often the result of an asymmetrical distribution of the magnetic flux within the motor. This is especially evident in motors with only a few pairs of poles. In such a case it is sufficient to disrupt the flow of current by insulating one of the two bearings. Situations also arise in which potential differences exist between the shaft and the housing. In this case electrical currents flow through each of the bearings supporting the shaft in the same direction. The most likely cause of such potential differences is the converters common-mode voltage. This type of situation might require the insulation of both bearings.

The type of electrical insulation which is to be used depends on the time response of the relevant voltages. For DC voltages and low frequency AC voltages the ohmic resistance of the bearing is the determining property for current insulation. With higher frequency AC voltages, which are often encountered in converters, the capacitive reactance of the bearing is an important parameter to consider when selecting the current insulation property of the bearing. Basically speaking, a current insulated bearing acts like a resistor and a capacitor connected in parallel. To ensure a good insulation, the resistance should be as high as possible and the capacitance should be as low as possible.

Irrespective of whether a bearing has been exposed to direct current or alternating current the resulting changes to the surface of the bearing are invariably the same, at least up to frequencies in the megahertz range. In both cases the electrical current forms uniformly dull grey marks at the raceways on the rolling elements. These marks are not very specific and can also be caused by other factors (for example by a film of lubricating oils containing abrasives). One can also find a type of washboard pattern that develops along the surface of the raceway of a bearing extending in the direction of rotation. This type of damage, which is referred to as "fluting" indicates that an electrical current has passed through the bearing. If the damage found in bearings as a result of current flow is examined under a scanning electron microscope, then it can be shown that the damage is characterized by densely packed craters caused by local melting and welding beads with micron sized diameters covering the raceways. Such damage can be definitively accepted as proof that electrical current has passed through the bearing. The craters and welding beads are the result of electrical discharges between the microscopic peaks that are always found in raceways and on rolling element surfaces. When a spark penetrates a fully developed lubricating film at a bottleneck, it causes the adjacent surface to momentarily melt. In the mixed friction range (metal-to-metal contact) the effective surfaces are temporarily fused together, then immediately broken apart again, by the rotation of the bearing. In both cases material also separates from the surfaces where it immediately solidifies to form welding beads. Some of these beads mix with the lubricant, the remainder are deposited on the surfaces. Craters and welding beads can be flattened and smoothed as the rolling elements continue to pass over them. If there is a continuous flow of current, the usually thin surface layers repeat the melting and solidifying process over and over again in the course of time.

Most actual bearing failures result from the "fluting" referred to above which seems to originate as a result of the combined effect of the continuous flow of electrical current and the vibrational properties of the bearing components. Each time the rolling element comes into contact with a sufficiently large crater it becomes radially displaced; the extent of the element's displacement depends on the bearing's internal geometry and speed as well as on the loads acting on the bearing. As the rolling element swings back the thickness of the lubricating film is eroded, resulting in more sparkovers in this area. A self-sustaining process has been triggered. After a while the entire circumference of the ring's raceway can be covered by fluting damage. This leads to more pronounced bearing vibrations, finally leading to bearing failure. A reliable criterion for assessing the level of danger posed by electrical current is referred to in the art as the "calculated current density", that is to say the effective amperage divided by the total area of contact between the rolling elements and the bearing's inner ring and outer ring. The current density is dependent on the type of bearing and on the operating conditions. According to current experience there is normally no risk of fluting when current densities are less than approximately 0.1, $A_{\mathit{eff}}/mm^2$. Densities that are above 1 $A_{\mathit{eff}}/mm^2$, are, however, likely to cause this type of damage.

The electrical current also negatively affects the lubricant. The base oil and additives in the oil tend to oxidize and cracks develop. This is clearly evident under the infrared spectrum. The lubricating properties are compromised by premature aging as well as by increased concentration of iron particles which can cause the bearing to overheat.

Having regard to the need to provide current insulated bearings, the typical concept is to use plasma spraying to apply oxide ceramic coatings. A special sealant helps the sprayed ceramic coating to retain its insulating properties even in a damp environment. The resulting oxide ceramic coating is very hard, wear resistant, and a good thermal conductor. Sometimes the outer race is coated at the outer side and sometimes the inner race is coated at the inner side. The bearings are usually made in such a way that the thickness of the coating is taken into account so that the ceramic coated bearings are interchangeable with standard bearings, for example in accordance with DIN 616, (ISO15). Bearings can be deep groove ball bearings and are available in both open and sealed versions (with lip seals on one or both sides). This enables the user to also benefit from the advantages offered by lubrication for life.

The plasma spraying process involves the generation of an arc between two electrodes to ionize a noble gas that is issued from the plasma torch. The resulting plasma jet is used to carry the injected aluminium oxide powder which is melted by the heat and sprayed at high speed onto the outer or inner ring. When applied in this manner, the oxide layer adheres extremely well to the base material and is then seated and ground to size. Current coatings are available that guarantee a dielectric strength of at least 1000 VDC or of at least 500 VDC.

Below this voltage the insulating layer only permits extremely low levels of current flow through the bearing. It offers resistance to DC currents and AC currents.

At room temperature the sprayed ceramic layer typically has a DC resistance of 1 to 10 GOhm depending on the bearing size. As the temperature increases the DC resistance decreases exponentially, typically by approximately 40 to 50% per 10° K. However, even at operating temperatures of 60° C. or even 80° C., the insulting layer still has a resistance of several MOhm. According to Ohm's law (i.e. I equals V divided by R) this means that voltages up to 1000 V only produce currents that are significantly below 1 milliampere which are not critical for bearings.

Having regard to AC resistance the insulating unit acts like a capacitor which can accumulate charges. When exposed to an AC voltage, this causes an alternating current to flow through the contact area between the rolling element and the raceways. In the case of a harmonic time dependence with an angular frequency w, the root mean square values for current and voltage are calculated using the formula $I=V.\omega.C$.

Analogous to Ohm's law $Z=1/\omega C$ is the capacitive reactance of the bearing. A bearing with an oxide ceramic coating typically has a capacitance of 2 to 20 of depending on the bearing size. Thus, at a frequency of 50 Hz, it has a capacitive reactance of 0.15 to 1.5 MOhm which is significantly lower than its DC resistance. At higher frequencies this value decreases even further. Nevertheless, in most cases, it will be significantly higher than the resistance of a non-insulated bearing which, at voltages higher than 1 V is very low (1 Ohm and less). The coating thicknesses that are used vary from somewhat less than 100 µm to average values of 200 µm or even above 200 µm.

One particular condition which should also be observed in the prior art is that the surfaces to be coated must be cylindrical, they must not be interrupted by lubricating holes or grooves.

Also known are hybrid bearings which typically have rings made from rolling bearing steel but ceramic rolling elements. The rolling elements are essentially wear-free and provide the requisite current insulation. Such bearings have a greater resistance to the passage of current than ceramic coated bearings. Even at high temperatures the DC resistance is in the GOhm range. The bearings typically have a capacitance of about 40 pf which is lower than for ceramic coated bearings by a factor of 100. Such rolling bearings have lower friction at higher speed which means reduced operating temperatures. They also have better dry running properties. Such hybrid bearings typically also have a longer grease life than traditional lubricated for life bearings.

Although the above description of the prior art relates generally to rolling element bearings, similar problems can arise in linear bearings and sliding bearings so that it can be advantageous in some circumstances to provide current insulation for such linear bearings or sliding bearings.

The principal object underlying the present invention is to provide a bearing component having a high hardness and high current insulation properties, the insulation property being understood to mean a voltage insulation property better than 500 VDC and preferably better than 1000 VDC, for an effective current of less than $0.1 A_e ff/mm^2$, with these values being achieved for significantly thinner coatings than the previously known coatings.

Furthermore, it is an object of the present invention to provide current insulated bearings in which grooves or lubrication holes in races are no longer a problem with regard to current insulation.

An additional object of the invention is to provide a coating which can be used not only on bearing races, but also on cages for the rolling elements and on the rolling elements themselves.

It is a yet further object of the present invention to provide current insulating coatings with high hardness which are relatively inexpensive to apply and which have excellent current insulation properties for various layer thicknesses. It is also desired to produce a current insulating coating having high uniformity and good reproducibility.

In order to satisfy this object there is provided, in accordance with the present invention, a bearing component for a linear bearing of a rolling element bearing and a sliding bearing, for example a component selected from the group comprising a bearing race, a rolling element such as a tapered roller, a barrel roller, a needle roller, a bearing ball and a rolling element cage, the bearing component having at least one layer having a high hardness and a high current insulation property applied by a PVD (physical vapor deposition) process, by a CVD (chemical vapor deposition) process, or by a PECVD (plasma enhanced chemical vapor deposition) process (but excluding an ALD process or a plasma enhanced ALD process) at at least one surface region of said article, said at least one layer comprising a non-conductive oxide layer selected from the group comprising an $Al_2O_3$ layer, a TaO layer (more generally a $Ta_xO_y$ layer), an SiO2, layer (more generally a $Si_xO_y$ layer), a mixed layer comprising two or more of the foregoing oxides, a multilayer structure comprising alternating layers of two or more of the foregoing oxides and a DLC layer such as a ta-C layer, there being at least one ALD layer comprising at least one layer of a material deposited by an ALD (atomic layer deposition) process on said at least one layer having a high hardness and a high current insulation property, the ALD layer itself having a high current insulation property and comprising a material or layer structure selected from the said group of materials.

Figure 2:
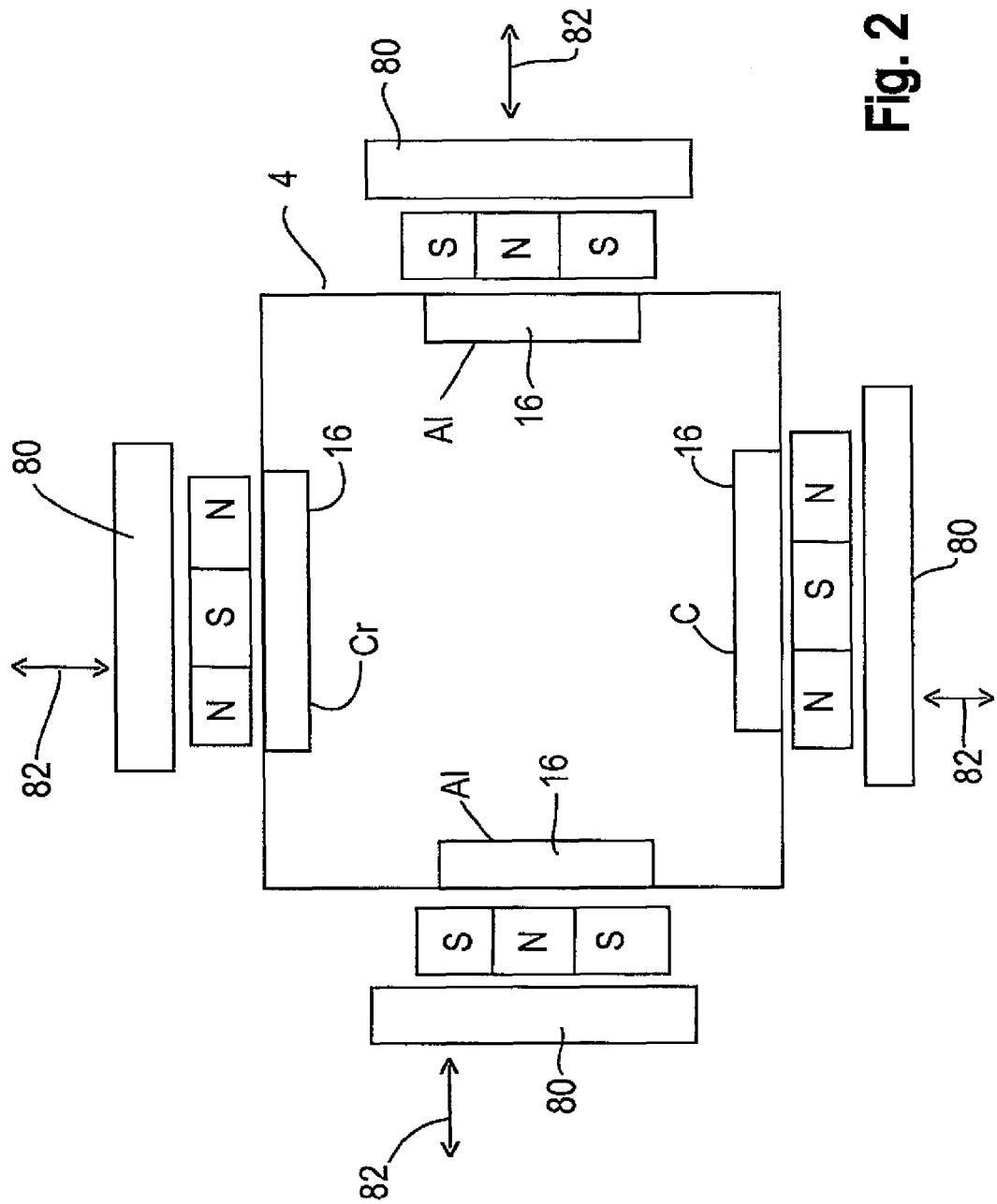
Figure 3A:
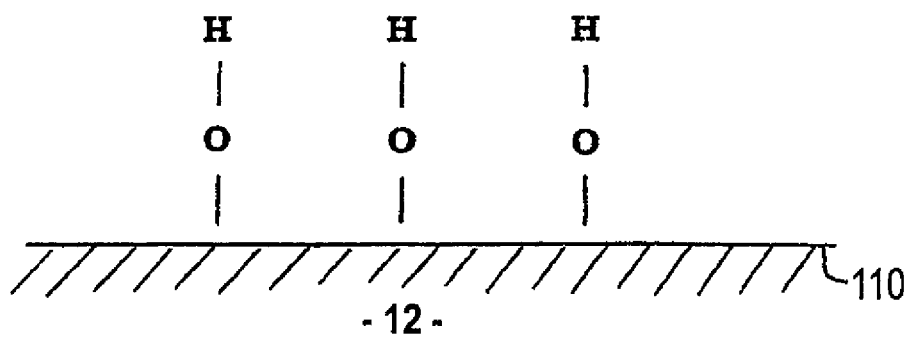
Figure 3B:
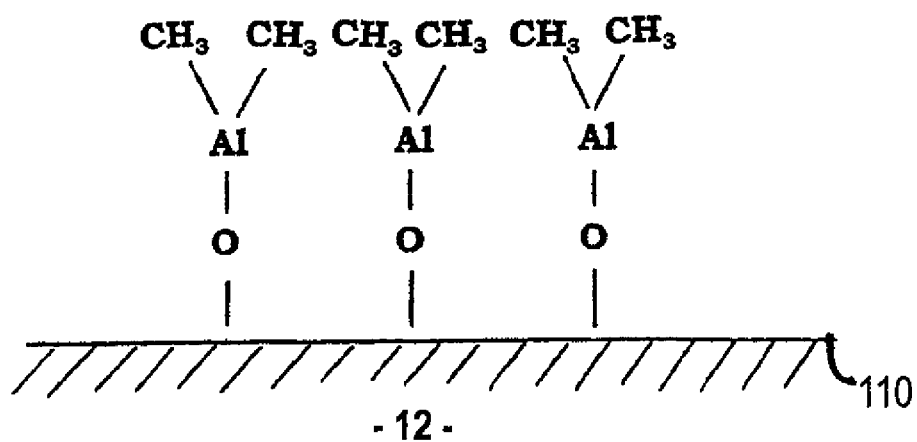
Figure 3C:
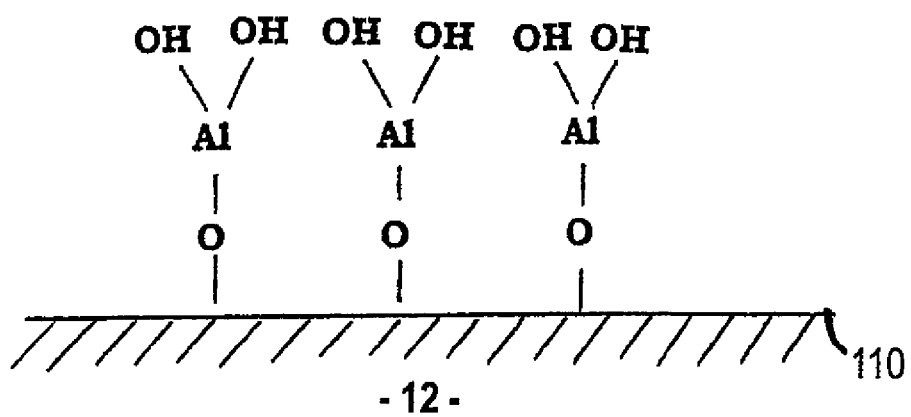
Figure 4A:
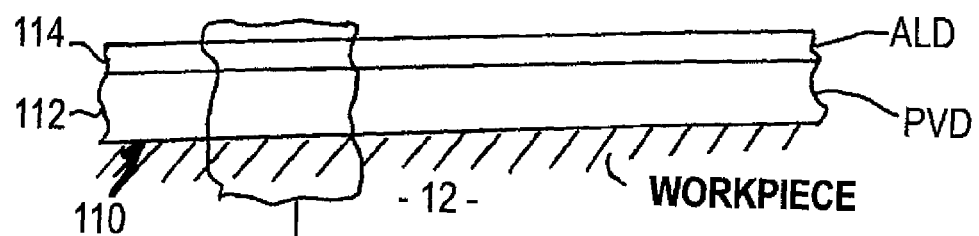
Figure 4B:
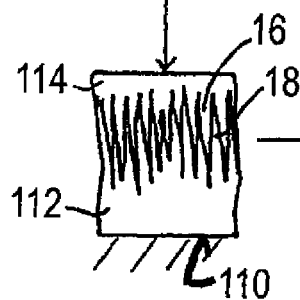
Figure 4C:
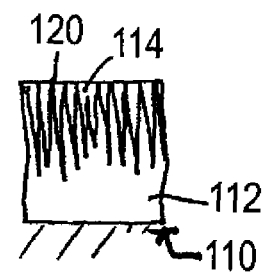
Figure 4D:
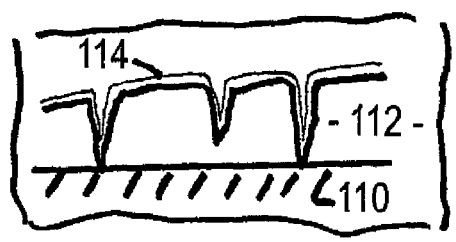
Figure 4E:
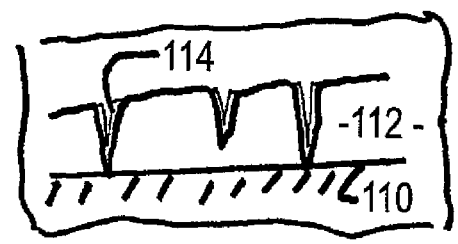
Figure 5:
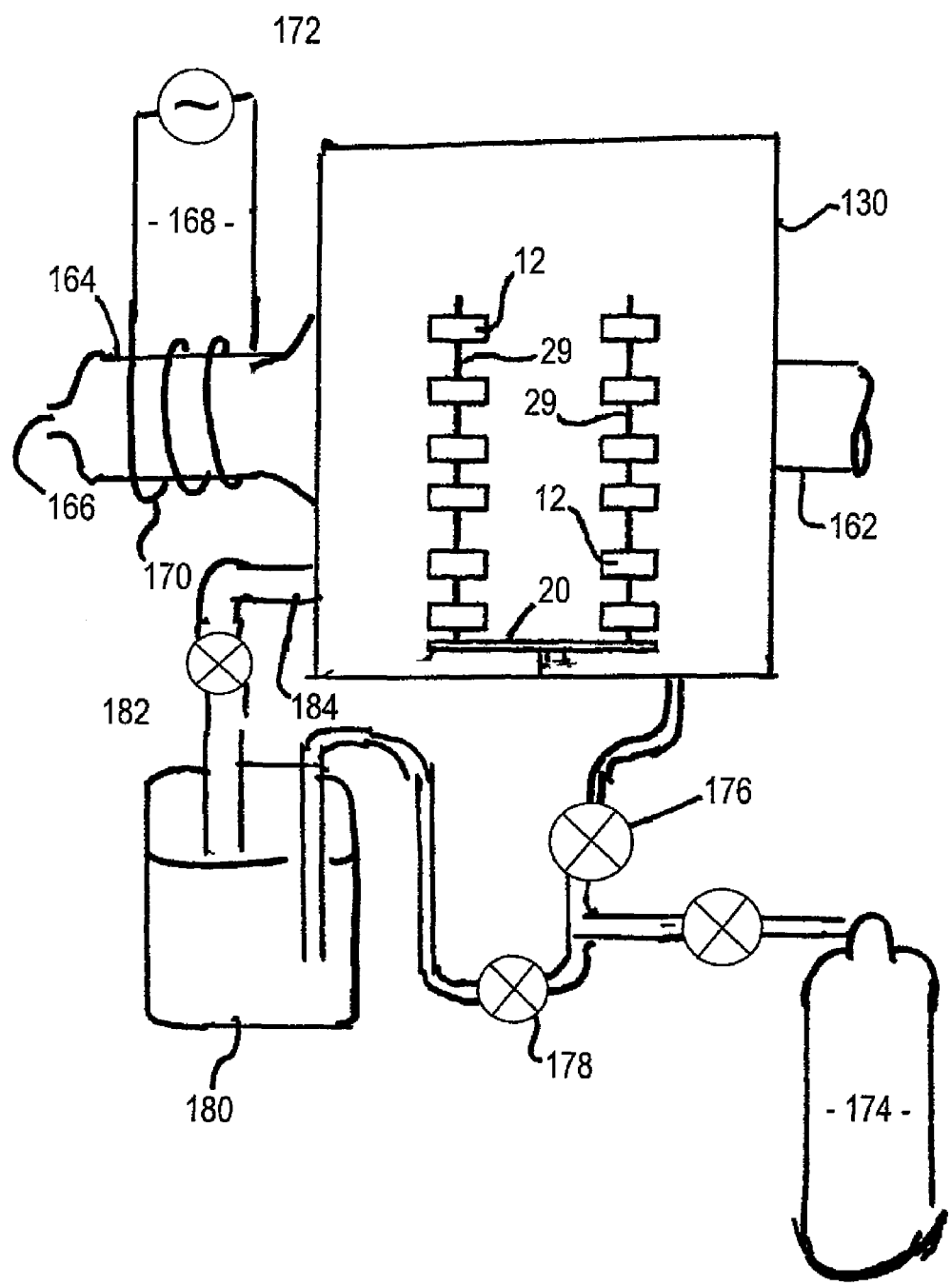

The invention will now be explained in more detail with reference to the accompanying drawings in which are shown:

FIG. 1 a schematic view of a cathode sputtering apparatus for depositing DLC coatings, FIG. 2 a cross-section through a modified version of the vacuum chamber of the apparatus of FIG. 1, FIGS. 3A-3C three sequential steps of an example for the deposition of an ALD layer, FIG. 4A a first composite coating in accordance with the present invention, FIG. 4B an enlarged view of a section of the composite coating of FIG. 4A, FIG. 4C an enlarged view of the coating of FIGS. 4A and 4B after the surface has worn away, FIG. 4D an enlarged view similar to FIG. 4B but with a thinner ALD sealing layer, FIG. 4E an enlarged view of the coating of FIG. 4D after the surface has worn away, FIG. 5 a chamber used for depositing ALD coatings and FIGS. 6A-6F examples of coating systems which are used for embodiments of the present invention.

In all drawings the same reference numerals have been used for the same components or features or for components having the same function and the description given for any particular component will not be repeated unnecessarily unless there is some distinction of importance. Thus a description given once for a particular component or feature will apply to any other component given the same reference numeral. Also the invention will be understood to include a method of coating a bearing component using PVD, CVD, PECVD processes for a first layer and ALD for depositing a second layer on the first layer.

By way of an introduction to DLC coatings (Diamond Like Carbon Coatings), reference can be made to a paper entitled "Diamond-like Carbon Coatings for tribological applications on Automotive Components" by R. Tietema, D. Doerwald, R. Jacobs and T. Krug presented at the 4th World Tribology Congress, Kyoto, September 2009. That paper discusses the manufacture of diamond-like carbon coatings from the beginning of the 1990's. As described there, the first diamond-like carbon coatings (DLC-coatings) were introduced on the market for automotive components. These coatings enabled the development of HP diesel fuel injection technology.

The German standard VDI 2840 ("Carbon films: Basic knowledge, film types and properties") provides a well-defined overview of the plurality of carbon films, which are all indicated as diamond or diamond-like coatings.

The important coatings for tribological applications are the hydrogen-free tetragonal "ta-C" coatings and further coatings of this kind with incorporated hydrogen referred to as ta-C:H coatings. Also of importance for tribological applications are amorphous carbon coatings with or without incorporated hydrogen which are respectively referred to as a-C coatings and a-C:H coatings. Moreover, use is frequently made of a-C:H:Me coatings which include metal carbide material such as tungsten carbide. a-C:H coatings can be deposited in known manner by CVD and especially by plasma enhanced CVD processes and by PVD processes. PVD processes are also used to deposit and a-C;H:Me coatings. These processes are well known per se as shown by the paper referred to above and they will not be described further here.

To date, the ta-C coatings have been made using an arc process. A hardness in the range from 20 GPa to 90 GPa, in particular 30 GPa to 80 GPa; is considered useful (diamond has a hardness of 100 Gpa). However, the coatings are quite rough because the arc process leads to the generation of macroparticles. The surface has rough points due to the macroparticles. Thus although low friction can be obtained the wear rate of the counterpart in the tribological system is relatively high due to the surface roughness caused by macroparticles.

Hydrogen free ta-C coatings are of particular interest for the present invention because of their good electrical insulating properties.

Referring first to FIG. 1 a vacuum coating apparatus 10 is shown for coating a plurality of substrates or workpieces 12. The apparatus includes a vacuum chamber 14 of metal, which in this example has at least one, preferably two or more magnetron cathodes 16 which are each provided with a high power impulse power supply 18 (of which only one is shown here) for the purpose of generating ions of a material which is present in the gas phase in the chamber 14, i.e. inert gas ions and/or ions of the materials of which the respective cathodes are formed. Two of the cathodes 16 are preferably oppositely disposed for operation in a dual magnetron sputtering mode. This can be advantageous for the deposition of Al2O3 coatings by magnetron sputtering as will be described later in more detail. The workpieces 12 are mounted on holding devices on a support device in the form of a table 20 which rotates in the direction of the arrow 22 by means of an electric motor 24. The electric motor drives a shaft 26 which is connected to the table 20. The shaft 26 passes through a lead-through 28 at the base of the chamber 14 in a sealed and isolated manner which is well known per se. This permits one terminal 30 of the bias power supply 32 to be connected via a lead 27 to the workpiece support table 20 and thus to the workpieces. This substrate bias power supply 32 is shown here with the letters BPS, an abbreviation for bias power supply. The BPS is preferably equipped with HIPIMS-biasing capability, as described in the EP application 07724122.2 published as WO2007/115819, in particular with regard to the embodiment of FIGS. 1 to 3 of that document. Although only a single rotation is shown here for the table 20, the trees 29 of the holding devices for the workpieces 12 can also be rotated about their own longitudinal axes (two-fold rotation) and if desired the workpieces can be rotated about their own axes (three-fold rotation) if the holding devices are appropriately designed.

Biasing can also be done by pulsed biasing or RF-biasing. Pulsed biasing can be synchronized with the HIPIMS-cathode pulses (also described in WO2007/115819). Good results can be achieved with the HIPIMS-DC biasing described in connection with FIGS. 1 to 3 of WO2007/115819.

In this embodiment the metallic housing of the vacuum chamber 14 is connected to ground. The positive terminal(s) of the high impulse cathode power supply(ies) 18 is/are likewise connected to the housing 14 and thus to ground 36 as well as the positive terminal of the bias power supply 32.

A further electric voltage supply 17 is provided for use when the apparatus is operated in a plasma enhanced chemical vapor deposition mode (PECVD) and will be explained later in more detail. It can be connected to the rotary table 20 instead of the bias power supply 32 by way of the switch 19. The electric voltage supply 17 is adapted to apply a periodically variable medium frequency voltage in the range of between of up to 9,000 volts, typically 500 to 2,500 volts, and at a frequency in the range between 20 and 250 kHz to the workpieces 12 mounted on the table 20.

A connection stub 40 is provided at the top of the vacuum chamber 14 (but could be located at other locations as well) and can be connected via a valve 42 and a further duct 44 to a vacuum system for the purpose of evacuating the treatment chamber 14. In practice this connection stub 40 is much larger than is shown, it forms the connection to a pumping stand which is suitable for generating a high vacuum in the chamber and is flanged onto the duct 44 or directly onto the chamber 14. The vacuum system or pumping stand is not shown but well known in this field.

A line 50, which serves for the supply of an inert gas, especially argon to the vacuum chamber 14, is likewise connected to the top of the vacuum chamber 14 via a valve 48 and a further connection stub 46. For supplying other process gases such as acetylene, oxygen or nitrogen, additional gas supply systems 43, 45, 47 can be used.

Vacuum coating apparatuses of the generally described kind are known in the prior art and frequently equipped with two or more cathodes 16. For example a vacuum coating apparatus is available from the company Hauzer Techno Coating BV in which the chamber has a generally square shape in cross-section with one cathode at each of the four sides. This design has one side designed as a door permitting access to the chamber 14. In another design the chamber is approximately octagonal in cross-section with two doors which each form three sides of the chamber. Each door can carry up to three magnetrons and associated cathodes 16. A typical vacuum coating apparatus includes a plurality of further devices which are not shown in the schematic drawings of this application. Such further devices comprise items such as dark space shields, heaters for the preheating of the substrates and sometimes electron beam sources or plasma sources in diverse designs. An ion source for use in the plasma enhanced chemical vapor deposition mode is shown in FIG. 1 by the reference numeral 21 and is positioned generally on the central longitudinal axis of the vacuum chamber. It can be a resistance heating filament connected to its own power supply or any other known design of ion source. The ion source 21 is connected to the negative output of a direct voltage supply (not shown). The positive pole of the direct voltage supply can be applied by way of a switch to the table 20 and thus to the holding devices and the workpieces 12 during the PECVD coating process.

The vacuum chamber of FIG. 1 is also equipped with two coils 23 and 25 at the top and at the bottom of the chamber respectively. These can be connected to a DC power supply or to respective DC power supplies, they operate as Helmholz coils and enhance the magnetic field along the axis of the chamber. The current flows through each of the coils 23 and 25 in the same sense. It is known that the plasma intensity and the current flowing at the workpieces 12 are proportional to the current flowing in the coils 23 and 25 and thus to the magnetic field generated thereby.

It is also possible to provide arc cathodes with respective arc power supplies in the same chamber in addition to magnetron cathodes.

The individual items of the coating apparatus are preferably all connected to a computer based process control. This makes it possible to coordinate all the basic functions of a vacuum coating apparatus (vacuum pumping system, vacuum level (pressure in the vacuum chamber), power supplies, switches, process gas supplies and gas flow control, currents in the coils 23 and 25, positions of any variably positioned magnets, safety controls etc.). It also makes it possible to allow the specific values of all relevant variable parameters to be flexibly matched at any point in time to the coating or process requirements and to produce coatings to specific repeatable recipes.

When using the apparatus air is first extracted from the vacuum chamber 14 by the vacuum pumping system via the duct 44, the valve 42 and the stub 40 and argon is supplied via the line 50, the valve 48 and the connection stub 46. The chamber and the workpieces are preheated during pumpdown to drive out any volatile gases or compounds which adhere to the workpieces or chamber walls The inert gas (argon), which is supplied to the chamber, is always ionized to an initial extent, for example by cosmic radiation and splits up into ions and electrons.

By generating a sufficiently high negative bias voltage on the workpieces, a glow discharge can be generated on the workpieces. The argon ions are attracted to the workpieces and collide there with the material of the workpieces, thus etching the workpieces.

Alternatively, Ar ions can be generated by a plasma source. The generated ions are attracted to the workpieces 12 by the negative substrate bias voltage and etch the workpieces 12.

As soon as the etching treatment has been carried out, the coating mode can be switched on. For a sputter discharge the cathodes will be activated during deposition. Ar ions collide with the target and knock atoms out of the target. Electrons are ejected from the target due to sputtering and are accelerated by the dark space voltage gradient. With their energy they can collide with Ar atoms, where secondary electrons will be emitted and help to maintain the discharge. Each of the cathodes is provided with a magnet system (not shown in FIG. 1) which is well known per se and which normally generates a magnetic tunnel in the form of a closed loop which extends over the surface of the associated cathode. This tunnel formed as a closed loop forces the electrons to move around the loop and collide with argon atoms causing further ionization in the gas atmosphere of the vacuum chamber 14. This in turn causes further ionization in the chamber from the material of the associated cathode and the generation of further argon ions. During deposition these ions can be attracted to the substrates by the applied negative bias voltage of for example 10 V to 1200 V and strike the surface of the workpieces with appropriate energy to control the coating properties.

In case of a HIPIMS discharge, a different discharge mode is effective. The number of ions increases dramatically and as a consequence the target material particles knocked out from the target will be ionized. This is not the case for a normal sputter discharge. As a consequence gases present in the chamber will be highly ionized as well. This is particularly beneficial when dopants are applied.

The power supply to the cathode or cathodes causes a flux of ions of the material of the cathode to move into the space occupied by the workpieces 12 and to coat them with the material of the respective cathode. The structure of the coating is influenced by the applied negative bias voltage that influences the movement of ions towards the workpieces.

Sputtering processes are known in diverse forms. There are those that operate with a constant voltage at the cathodes and a constant negative voltage at the workpieces and this is termed DC magnetron sputtering. Pulsed DC sputtering is likewise known in which at least one of the cathodes is operated in a pulsed mode, i.e. pulsed power is applied to the cathode by a pulsed power supply.

A special form of a pulsed discharge is the HIPIMS discharge. In a HIPIMS mode the power which is supplied to each cathode during a power impulse can be much higher than the power of a DC sputtering mode because there are substantial intervals between each pulse. However, the average power remains the same as for DC puttering. The limiting constraint on the power is the amount of heat that can be dissipated at the cathode before this overheats.

The use of HIPIMS leads to a higher ionization in the vacuum chamber and improved coatings. For example, in well-known HIPIMS sputtering (high power impulse magnetron sputtering), each power pulse can have a duration of say 10 μs and a pulse repetition time is used of say 2000 μs, (corresponding to a pulse repetition frequency of 500 Hz, i.e. a spacing between impulses of 1990 μs). As another example, the pulse repetition frequency might be 50 Hz and the pulse duration 100 μs, i.e. a spacing between impulses of 20 ms-100 μs. These values are only given as an example and can be varied in wide limits. For example, an impulse duration can be selected between 10 μs and 4 ms and a pulse repetition time between 200 μs and 1 s. As the time during which a very high peak power is applied to the cathodes is short, the average power can be kept to a moderate level equivalent to that of a DC sputtering process. It has been found that by the application of high power impulses at the cathode these operate in a different mode in which a very high degree of ionization of the ions arises which are ejected from the cathodes: This degree of ionization, which is material dependent, can lie in the range between 40% and 90%. As a result of this high degree of ionization, many more ions are attracted by the workpieces and arrive there with higher velocities which lead to denser coatings and make it possible to achieve completely different and better coating properties than is possible with regular sputtering or arc coating.

The fact that the power is supplied in power peaks means, however, that relatively high currents flow in the bias power supply during these power peaks and the current take up cannot be readily supplied by a normal power supply.

In order to overcome this difficulty, WO 2007/115819 describes a solution as shown in FIG. 1 of this application in connection with the bias power supply BPS (32) in which an additional voltage source 60 is provided. The additional voltage source 60 is best realized by a capacitor. The capacitor 60 is charged by a customary bias power supply to the desired output voltage. When a power impulse arrives at one of the cathodes from the HIPIMS power supply 18 then this leads to an increased material flow of ions, essentially ions of the cathode material to the workpieces 12 and this signifies an increase of the bias current at the bias power supply via the workpiece support table 20 and the line 27. A normal bias power supply could not deliver such a peak current when it is designed for constant DC operation instead of HIPIMS operation. However, the capacitor 62, which is charged by the bias power supply to the desired voltage in the periods between the power impulses, is able to keep the desired bias at the substrates constant within narrow limits and to supply the required current which only causes a small degree of discharging of the capacitor. In this way, the bias voltage remains at least substantially constant.

By way of example the discharge can take place in such a way that a bias voltage of −50 V drops during the power pulses to −40 V.

In a simple form of the present teaching one of the cathodes 16 is a Cr, Ti or Si target for supplying a bond layer material. Possibly, other materials could also be used for a bond layer.

When depositing a DLC layer in the form of a ta-C layer the workpieces were positioned on a table 20 and were made by a PVD arc process from a carbon cathode in manner known per se. The chamber 10 had a working height of the space in which the workpieces are located of 850 mm. To ensure good adhesion of the hard hydrogen-free carbon layer on the substrate, the apparatus initially used a standard ARC adhesion layer such as is used when depositing ta-C by carbon arc. It will not be described in detail because it is not the preferred solution and the arc process is in any case well known.

FIG. 2 shows a view of the vacuum chamber of FIG. 1 in a cross-section perpendicular to the vertical axis with additional detail but without the workpieces. The chamber also has four cathodes, one of Cr as a bond layer material, one of graphite as a source of carbon and two of aluminium for forming an Al2O3 layer by dual magnetron sputtering in a reactive oxygen atmosphere.

The two cathodes 16 labelled also Al are of aluminium and have magnet arrangements with center poles of polarity "north" (N) and outside poles of polarity "south" (S) to generate the well-known magnetic tunnel of a magnetron. The cathodes have the shape of elongate rectangles when viewed face on and are shown here in a cross-section perpendicular to their long axis. Instead of having SNS polarity as shown, they could have NSN polarity as shown for the magnet arrangements for the cathodes of Cr and C at the top and bottom of FIG. 2. The cathodes 16 of Cr and C would then have magnet arrangements with SNS polarity.

The magnet arrangements can be moved in the direction of the respective double arrows 82 towards and away from the respective cathodes 16. This is an important control parameter for the operation of the HIPIMS cathodes.

The idea is for the magnetrons to have alternating polarities going around the vacuum chamber 14. This means, with an even number of cathodes, that the magnetic poles always alternate, i.e. N, S, N, S, N, S, N, S, N, S, N, S, when going around the chamber. This leads to an enhanced magnetic confinement of the plasma. A similar magnetic confinement can also be achieved if all cathodes have the same polarities, say NSN. Then it is necessary to operate with auxiliary S poles between the adjacent magnetrons to obtain a similar N, S, N, S, N arrangement around the chamber. It will be appreciated that the described arrangements only work with an even number of magnetrons. However, it is also possible to obtain a similar effect with an odd number of magnetrons either by making some poles to be stronger than others or by the use of auxiliary poles. Such designs to obtain a closed plasma are well known and documented in various patent applications. It is not essential that a closed plasma is achieved.

What FIG. 2 also shows is four rectangular coils 80 positioned outside of the chamber 14 like the magnets with the SNS poles or NSN poles. The coils form electromagnets and have the same polarity as the outer magnets for the respective cathodes 16. These electromagnetic coils 80 enable the magnetic flux in front of the cathodes 16 and inside the chamber 14, to be varied.

The vacuum coating system can be operated as follows:

The chamber and the workpieces located in it are first evacuated to a low pressure less than $10^{-4}$ mbar, such as $10^{-5}$ mbar, and preheated while supplying argon to the chamber at a flow rate of, for example 75 sccm. During this period the heating of the chamber and the workpieces drives out contamination such as gases and water adsorbed on the surface of the workpieces and on the chamber walls and this contamination is removed by the vacuum system along with the remaining environmental gas in the vacuum chamber and a proportion of the argon gas that is supplied. Thus the argon gas gradually flushes the vacuum chamber. After this preheating and cleaning step further cleaning is effected during a cleaning and etching treatment. This treatment is carried out on the workpieces 12 with Ar ions, using the argon atmosphere in the vacuum chamber. This step is carried out for a period of 10 to 30 minutes. The ion source can be the ion source 21 referred to above or another ion source.

Another option for the etching step is the use of HIPIMS etching with a Cr, Ti or Si target operated in a HIPIMS magnetron etching mode with a relatively high substrate bias of −500 to −2000 V. This is well known in the art and described in EP-B-1260603 of Sheffield Hallam University. The typical time averaged equivalent DC etching power applied to the Cr, Ti or Si cathode is in the range of 1 to 25 kW.

In a second step a bond layer of Cr, Ti or Si is deposited on the metal surface. This is done for about 10 to 20 minutes from a target of Cr, Ti or Si operated in a sputter discharge mode or in a HIPIMS coating mode. In this connection it should be noted that, in case of using a HIPIMS mode, the maximum average power which can be dissipated by and thus effectively applied to a cathode is the power which does not lead to an undesirable temperature increase of the cathode or unwanted melting thereof. Thus in a DC sputtering operation a maximum power of approximately 15 W/cm2 might be applied to a particular cathode in the case of indirectly cooled targets, corresponding to the allowable thermal load of the target. In HIPIMS operation a pulsed power supply is used which might typically apply power in 10 to 4000 µs wide pulses at a pulse repetition frequency of less than 1 Hz-5 kHz. In an example: if the pulse is switched on during 20 µsec and a pulse frequency of 5 kHz is applied, each pulse would then have a power associated with it of 180, kW resulting in an average power of $$P=180\ kW \times (20\ \mu s/(200-20)\mu s=20\ kW$$

For this example the maximum pulse power that can be supplied during a HIPIMS pulse is thus 180 kW.

An appropriate negative substrate bias of about 0 to 200V should be provided during the deposition of the bond layer. The pressure in the chamber may be between $10^{-4}$ and $10^{-3}$ mbar. The deposition of the bond layer can also be done with filtered arc cathodes. Also the use of unfiltered arc cathodes is a possibility, but this is less advantageous because it will lead to additional roughness of the coating because of droplet generation.

In a third step a Cr—C, Ti—C or Si—C transition layer is deposited for about 1 to 5 minutes with simultaneous operation of a Cr, Ti or Si target and a graphite target in a HIPIMS mode or with carbon-arc cathodes with about −50 to −2000 V substrate bias. The pressure in the chamber can again be in the range between $10^{-4}$ and $10^{-3}$ mbar.

Thus, the apparatus of the invention typically comprises a plurality of magnetrons and associated cathodes, at least one of which comprises a bond layer material (Cr, Ti or Si). The at least one cathode for the bond layer material can also be an arc cathode (filtered, or unfiltered). The apparatus further comprises a power supply for the sputtering of bond layer material for the deposition of the bond layer material on the substrate or substrates prior to deposition of the DLC layer. A typical example of a bond layer material is as already stated Cr, Ti or Si. Thus there will usually be a minimum of two cathodes, typically one of Cr and one of graphite. In practice it may be more convenient to use a sputtering apparatus with four or more cathodes. This makes it relatively easy to arrange the magnetrons and/or the arc cathodes so that there is an alternating pole arrangement of N, S, N; (magnetron 1) S, N, S (magnetron 2); N, S, N (magnetron 3) and S, N, S (magnetron 4) arranged around the periphery of the vacuum chamber in manner known per se to ensure stronger magnetic confinement of the plasma (closed field).

The pulse repetition frequency is preferably in the range from 1 Hz to 2 kHz, especially in the range from 1 Hz to 1.5 kHz and in particular of about 10 to 30 Hz.

If an a-C:H or a ta-C coating is used then dopants can be added to the coating. In this respect dopants can be metals from sputter targets operated with arc sputtering or magnetron sputtering or from HIPIMS cathodes (Si, Cr, Ti, W, WC). The dopants can also be supplied from precursors in gas phase (such as hydrocarbon gases, nitrogen, oxygen, Si containing precursors like silane, HMDSO, TMS). The invention also comprises the use of dopants to the ta-C coating) so long as the dopants do not undesirably reduce the insulating properties so that the calculated current density exceeds the permissible value.

A specific example for the deposition of an a-C:H layer, i.e. a DLC layer coating containing hydrogen will now be described:

In known manner the treatment process is first started by pumping the chamber down to a relatively low pressure at least one order of magnitude below the actual chamber pressure for the deposition process, e.g. to a pressure less than $10^{-4}$ such as $10^{-5}$ mbar. During this, or following this, the chamber and its contents are subjected in known manner to a heating process to drive of the volatile gases in the chamber and adsorbed onto the surfaces of the chamber and the items present there. During the preheating a flow of argon is maintained in the chamber by supplying argon through the inlet and removing it via the vacuum pump. The heating phase typically lasts about 20 to 25 minutes.

Following the preheating process etching takes place once a steady temperature has been reached. The etching is for example carried out using a HIPIMS etching process as covered by European patent EP-B-1260603 although other etching processes can also be used. During etching argon gas is supplied to the vacuum chamber for example at 75 sccm and ionized by operation of one or more of the magnetrons incorporated therein, for example the magnetron with the target 16 of Cr can be used.

If deemed necessary, the workpiece can be provided with an adhesive layer, also termed a bond layer, to facilitate the adhesion of the DLC coating. Such a bond layer is not always necessary. For some workpiece materials, especially those with a content of Cr, Ti or Si, such as 100 Cr6, the DLC layer, or some types of DLC layer could be deposited directly on the cleaned and etched workpieces without the use of a bond layer. If an adhesive layer is provided on the workpiece then it can be selected from the group of elements of the IV, V and VI Subgroup as well as Si. Preferably an adhesive layer of the elements Cr or Ti is used which have been found to be particularly suitable for this purpose.

The adhesive layer can be deposited by arc sputtering or filtered arc sputtering, but is preferably deposited using magnetron sputtering from the Cr target 16 in FIG. 2.

Again, argon is supplied to the vacuum chamber. During this phase the argon flow is higher than during pre-heating and etching and may, for example, be set at 120 sccm. The pressure in the vacuum chamber is typically around $10^{-3}$ mbar but can be up to an order of magnitude lower or can be somewhat higher than $10^{-3}$ mbar. A negative bias of around 50 V is applied to the substrate carrier and the deposition of the bonding layer takes only a few minutes with about 10 kW of power applied to the cathode (average power if the magnetron cathode is operated in the HIPIMS mode).

It can also be advantageous to provide a gradient layer between the adhesive layer and the DLC layer. Such a gradient layer can further improve the adhesion of the DLC layer on the workpiece.

The idea of the gradient layer is to progressively reduce the proportion of Cr in the gradient layer while increasing the proportion of carbon in it thus forming chromium carbide and allowing the carbon content to increase until only a DLC coating is being applied.

There are several possibilities for depositing the gradient layer. One possibility is to operate the magnetron with the carbon target 16 simultaneously to the Cr target, e.g. again using HIPIMS sputtering. The power supplied to the Cr target is progressively reduced, or reduced in steps, while the power supplied to the C target is progressively increased, or increased in steps. Another possibility is to add carbon to the vacuum chamber in the form of a reactive gas such as acetylene or methane and to progressively increase the amount of carbon present in the atmosphere of the chamber while reducing the power supplied to the Cr target.

Another possibility is to use the technique described in EP-B-1272683 for the deposition of an adhesive layer, of a graded layer and subsequently a DLC layer.

If that process is used then, after deposition of part of the Cr layer, i.e. part of the adhesive layer, the substrate bias is switched over from direct current to medium frequency by using the switch 19 to connect the electric voltage supply 17, which is a bipolar generator, to the table 20 instead of the constant bias supply 32. The electric voltage supply is operated with a preferred amplitude voltage of between 500 and 2,500 V, for example 700 V, and a frequency between 20 and 250 kHz, for example 50 kHz. The pressure in the vacuum chamber is typically around $10^{-3}$ mbar, but can be up to an order of magnitude lower or can be somewhat higher than $10^{-3}$ mbar. After approximately 2 minutes, an acetylene ramp is started at 50 sccm and is raised over a time period of approximately 30 minutes to 350 sccm. Approximately 5 minutes after switching on the medium frequency generator, the power of the used Cr target is reduced to 7 kW; after another 10 minutes, it is reduced to 5 kW and is held constant there for another 2 minutes. Thus, for the generation of a graded adhesive layer acetylene (or another carbon containing gas) can be supplied to the vacuum chamber in increasing amounts during the deposition of the adhesive or bonding layer after about one third of that layer has been deposited so that the composition of the adhesive layer or bonding layer progressively changes from chromium to chromium carbide.

Once the gradient layer has been completed, screens are moved in front of the targets and these are switched off, whereby the depositing of the "pure" DLC layer starts which is constructed essentially of carbon atoms, of low quantities of hydrogen and of still lower quantities of argon atoms.

For this purpose, in the simplest case, the process can be completed with switched-off vaporizing sources, but otherwise with the same parameters as in the case of the preceding gradient layer. However, it was found to be advantageous either to increase the hydrocarbon fraction in the gas flow in the course of the deposition of the pure DLC layer or to lower the noble gas fraction or, particularly preferably, to carry out both measures jointly. Here also, the use of the coils 23 and 25 to form a longitudinal magnetic field, as described above, again has a special significance for maintaining a stable plasma.

During the application of the pure DLC layer, after the switching-off of the Cr target, the medium frequency supply is adjusted to remain constant and the argon flow remains the same, the acetylene ramp started during the gradient layer is increased for approximately 10 minutes uniformly to a flow between approximately 200 and 400 sccm. Subsequently, for a time period of 5 minutes, the argon flow is continuously reduced to a flow between approximately 0 and 100 sccm, for example to 50 sccm. During the next 55 minutes, the process is completed while the settings remain the same. The pressure in the vacuum chamber is typically around $10^{-3}$ mbar but can be up to an order of magnitude lower or can be somewhat higher than $10^{-3}$ mbar. The upper coil is operated with an excitation current of about 10 A and the lower coil with an excitation current about one third of that of the top coil.

The deposition of the DLC layer thus takes place by a plasma assisted CVD (chemical vapor deposition) process. The plasma assistance comes from the plasma generated by the ion source 21 in combination with the vacuum in the chamber and the magnetic field generated in the chamber by the upper and lower coils 23 and 25 respectively as well as the contributions to the magnetic field of the other magnets that are present or in operation such as the magnets associated with the magnetrons (which are operative to generate magnetic fields even if magnetron sputtering is not taking place).

These conditions lead to a relatively high deposition rate and the ionization of the plasma is ensured by the presence of the argon gas. The depositing rate will typically be about 1 to 2 microns per hour.

The DLC coating has a hardness of about 25 GPa and a coefficient of friction of about 0.2. It has a hydrogen content of about 13% and a resistance of around 500 kOhm. The adhesion of the DLC coating, which can be measured according to DVI 3824, Sheet 4, is very good and can be classified as HF1, according to the DVI 3824, document.

The layer roughness of the DLC layer has a value of Ra=0.01–0.04; Rz as measured according to DIN is <0.8, and usually <0.5.

There are many other possibilities for depositing a DLC layer on a steel workpiece. For example, some possible processes which can be used in the present invention are described in various prior art documents. Thus, a plasma assisted chemical vapor deposition technique for depositing alternating layers of DLC and silicon-DLC layers as a hard coating with good frictional properties and hardness as well as corrosion resistance is described in EP-A-651069.

EP-A-600533 describes a method of depositing a DLC coating on an iron substrate with a graded transition layer of a-Si1-xCx:H by PACVD using silane gas enriched with hydrogen for the Si source and methane enriched with hydrogen for the carbon source. A thin layer of Si of 15 nm thickness is first deposited followed by the graded layer of 25 nm thickness, with the proportion of Si decreasing and the proportion of C increasing, and is capped by a relatively thick DLC layer to a total layer thickness of 2.3 microns.

DE-C-19513614 also describes the manufacture of DLC layers on steel substrates by a plasma enhanced CVD process operated in a pressure range between 50-1,000 Pa using a thin graded Si carbon layer similar to that of EP-A-600533. The deposition process uses a bipolar voltage source connected to the workpieces and the bipolar voltage source is designed such that during the deposition process the positive pulse duration is smaller than the negative pulse duration. As a result, layers are deposited in the range of from 10 nm to 10 μm and of a hardness of between 15-40 GPa.

Yet another method for applying hard DLC layers by plasma enhanced chemical vapor deposition is described in U.S. Pat. No. 4,728,529. This US document describes a method for depositing DLC while applying an HF plasma, during which the layer formation takes place in a pressure range of between $10^{-3}$ and 1 mbar using an oxygen-free hydrocarbon plasma which includes an admixed noble gas or hydrogen.

DE-A-19826259 describes multilayer structures of metal carbide layers (titanium carbide or chromium carbide) alternating with a-C:H (DLC) layers.

Once a DLC coating of the desired thickness has been achieved the PVD coating process is complete and the workpieces can be transferred to another vacuum chamber such as FIG. 5 for the deposition of the ALD coating.

Turning first to FIGS. 3A to 3C there can be seen a sequence of steps for the formation of a first ALD layer. In the step of FIG. 3A a workpiece or article 12 having an O—H terminated surface is created. This can be done in a vacuum chamber, described later with reference to FIG. 5, by admitting water to the chamber under CVD (chemical vapor deposition) conditions, especially under PECVD (plasma enhanced chemical vapor deposition) conditions, i.e. in the presence of a plasma, as is well known from the field of wafer bonding. Prior to this step the substrate can be subjected to extensive cleaning and etching, for example under PVD (physical vapor deposition) conditions, e.g. by subjecting the surface to argon ion bombardment as discussed below with reference to FIG. 5.

Once the —O—H terminated surface has been formed the water is removed from the chamber by the vacuum pump and the substrate with the —O—H terminated surface is exposed to an atmosphere of trimethyl aluminium $(CH_3)_3Al$ under the same conditions and this results in an Al atom taking the place of the hydrogen atom and the other two bonds of the aluminium atom being respectively occupied by a $CH_3$ group. This situation is shown in FIG. 3B. The reaction with the trimethyl aluminium has now ceased because no further possibilities for chemical reaction exist. The excess trimethyl aluminium, together with the $CH_4$ formed by the reaction of trimethyl aluminium with the hydrogen atoms of the —O—H terminated surface $$((CH_3)_3Al + H \rightarrow (CH_3 + H + {}_2CH_3Al) \text{ and } CH_3 + H \rightarrow CH_4),$$

are extracted by the vacuum system and the reaction has stopped chemically after the generation of just one atomic (molecular) layer.

In the next step water is again admitted to the chamber under CVD or PECVD conditions and leads to the following reaction on the surface with the $CH_3$, terminated Al:

$$2CH_3 + H_2O \rightarrow 2CH_4 + 2(-OH)$$

The 2-OH radicals bond to the aluminium to result in the situation shown in FIG. 3C. These reactions typically take place in the temperature range from 100° C. to 400° C. The CH4 which is formed is sucked away out of the vacuum chamber by the vacuum pump together with the excess water vapor. Again the reaction is chemically stopped once all $CH_3$ groups have been substituted by —OH groups.

It will be appreciated that the situation shown in FIG. 3C equates to that of FIG. 3A and therefore the process can be repeated each time building up a further ALD layer of $Al_2O_3$. In principle there is no limit to the number of layers that can be built up in this way although more layers signifies longer treatment times and therefore no more layers than are necessary are provided. In the example given of the deposition of $Al_2O_3$ layers these are high quality layers which are very dense and able to stop corrosive substances reaching the substrate 10. It should be noted that the present invention is not restricted to the deposition of $Al_2O_3$ layers but can in principle be used with all layer materials capable of being grown by ALD including: $Al_2O_3$, TaO, $SiO_2$, $TiO_2$, $Ta_2O_5$, $HfO_2$, a mixed layer comprising two or more of the foregoing oxides, a multilayer structure comprising alternating layers of two or more of the foregoing oxides or even a DLC layer such as a ta-C layer if it can be grown by ALD. The deposition of these materials by ALD can be done using the reagents described in the IC Knowledge publication "2004 IC Technology". One particular application for the ALD process is in the manufacture of integrated circuits and the process is described in this connection in some detail in the IC Knowledge publication "2004 IC Technology". The details described there can be of assistance in realizing the present teaching and the disclosure of that reference in this respect is included herein by reference.

A much longer listing of coatings which can be produced by ALD processes can be found in the paper by Riikka L. Puurunen entitled "Surface chemistry of atomic layer deposition: A case study for the trimethylaluminum/water process" which issued in the Journal Of Applied Physics 97, 121301 in 2005, pages 121301-1 to 121301-52. This paper gives extensive details of the ALD-process and summarizes the work which has been published by others in the field. The details described there can be of assistance in realizing the present teaching and the disclosure of that reference in this respect is included herein by reference. As confirmed by the Puurunen paper referenced above the term ALD layer or atomic layer deposition is somewhat misleading. Although the process can be conveniently considered as if each cycle of the process is used to deposit one or more layers each essentially one atom thick if the coating used is a coating of an element such as Cu, Mo, Ni, Ta, Ti or W in the above list. If the coating is molecular, e.g. an $Al_2O_3$ coating, then the name is strictly speaking incorrect but internationally understood. Moreover, as stressed by Puurunen, the actual growth per cycle of the ALD process can be less than one, since not all sites on the substrate or on the preceding ALD layer are necessarily reactive sites for a variety of reasons.

It should be noted that the ALD process described above is one example of how the process can take place and is in no way to be understood as a limiting example. The trimethyl aluminium can also bond "simultaneously" on two OH groups on the surface and then have only one methyl group sticking out. Both will occur. Which one will occur preferentially has to do (among others) with the degree of steric hindrance, which more or less means what has the best geometrical fit. Another variant of the ALD process using trimethyl aluminium and water is described in the document "Plasma Assisted Atomic Deposition of TiN films, Jun. 23, 2004" authored by Stephan Heil of the Technical University of Eindhoven. The details described there can be of assistance in realizing the present teaching and the disclosure of that reference in this respect is included herein by reference.

In addition it is known to deposit $Al_2O_3$ by ALD using oxygen ($O_2$) as a precursor. This is particularly attractive because the use of water requires significant purging of the ALD chamber. The use of $O_2$ for the deposition of is described $Al_2O_3$ by ALD is for example described in the PhD thesis of Dr. Stephan Heil dated Jun. 29, 2008 and entitled "Atomic layer deposition of Metal Oxide and Nitrides". The details described there can be of assistance in realizing the present teaching and the disclosure of that reference in this respect is included herein by reference.

A first coated article 12 made in accordance with the present invention is shown in FIG. 4A. The article, of which only a surface region 110 is shown here and which is referred to as the substrate in the following, has at least one first layer 112 applied by a PVD (physical vapor deposition) process or by a CVD (chemical vapor deposition) process, e.g. a PECVD (plasma enhanced chemical vapor deposition) process at the surface region 110 and a second layer 114 comprising one or more atomic layers of an electrically insulating material deposited by an ALD (atomic layer deposition) process at the same surface region 110.

The PVD or CVD layer 112 is an electrically insulating layer as described above with reference to FIGS. 1 and 2 and generally has a high hardness and high wear resistance, optionally with a low coefficient of friction. In this example the layer 110 is a DLC layer applied directly onto the surface of a martensitic steel workpiece, i.e. without a bond layer or a graded layer between the DLC layer and the workpiece, although such layers can be provided if desired or if necessary to obtain good adhesion of the DLC layer and/or to prevent spalling. The ALD layers 114 are $Al_2O_3$ layers. The DLC layer 112 typically has a columnar structure and/or a porous structure which would otherwise allow corrosive substances such as liquids or gases to reach the substrate and cause corrosion there.

Such a columnar structure and/or porous structure would, in the absence of the electrically insulating ALD layer 114 be a poor coating from the point of view of electrical isolation despite the fact that the coating itself is a good insulator. The point is that the columnar or porous structure means small areas of the article surface are effectively exposed and, particularly with thin coatings, can readily lead to local conducting pathways which must be avoided. This is achieved by the conformal sealing layer in the form of the ALD layer (layer system) 114.

In a bearing component such as a rolling element bearing the coating would normally be applied to the outer surfaces of the outer bearing race and/or to the radially inner surfaces of the inner bearing race, but generally not to the raceway surfaces themselves which are in contact with the rolling elements. An exception to this exists however when the layer that is applied by a PVD (physical vapor deposition) process, by a CVD (chemical vapor deposition) process, or by a PECVD (plasma enhanced chemical vapor deposition) process (but excluding an ALD process or a plasma enhanced ALD process) has a high hardness and a high resistance to wear such as a DLC layer because then the raceways of the inner an/or outer races could also be coated. This applies even if the ALD layer applied to the aforementioned layer wears away from the surface of the aforementioned layer, since the ALD layer is only very thin.

Coatings applied to the outer surfaces of the outer bearing race and/or to the radially inner surfaces of the inner bearing race do not necessarily have to be extremely hard or wear resistant because they are not intended to move within the housing or on the associated shaft. Nevertheless, hard and wear resistant coatings are preferred at such locations because the inner and outer races may shuffle within the housing or on the shaft.

Since the coatings of the present invention tend to be extremely hard or wear resistant and are also extremely thin they can also be formed on the raceway surfaces if they are sufficiently hard and wear resistant. Theoretically at least the coating could also be provided on the rolling elements if desired.

As shown in FIG. 4A the surface region 110 of the article or substrate has a PVD or CVD layer 112 deposited directly on it and the ALD layer (layer system) 114 is deposited on the PVD or CVD layer 112. The enlarged view of FIG. 4B is very instructive in connection with this embodiment. Here the enlarged view has been drawn in exaggerated manner to show the columnar structure of the PVD or CVD layer 112. Purely for the sake of illustration FIG. 4B illustrates the interstitial passages 116 formed between the columns 118 of the PVD or CVD layer 112.

This embodiment recognizes and exploits an important advantage of the ALD process, that the atomic layer growth can take place in deep and narrow gaps, i.e. here on the side walls of the interstitial passages and on the side walls of open pores and of any other defects such as cracks. This means that even if only a few layers are grown by ALD these are sufficient to seal the PVD layer. If enough ALD layers are grown they can seal the open pores and interstitial passages as shown in FIG. 4B and achieve excellent electrical insulation.

However, this is not necessary for the open pores, interstitial spaces or other defects to be fully filled with ALD grown material. It is sufficient if the ALD layer 114 only lines the side walls of any columns, pores or other defects that are present. This situation is shown in FIG. 4D. Generally speaking it is sufficient if the ALD layer 114 comprises a plurality of monolayers having a thickness in the range from 1 nm to 50 nm . Thin layers of 1 nm or a few nm in thickness can be deposited relatively quickly because the number of repetitions (cycles) of the ALD process necessary to build up the layer 114 is restricted.

When the conformal ALD layer 114, which is itself usually extremely hard, wears significantly in use then it wears down until the surface of the PVD or CVD layer is exposed, as shown in FIGS. 4C and 4E and thereafter wear is insignificant for a long period of time as a result of the hard DLC layer. During this long period of time the substrate 10 is protected by the PVD or CVD layer 112 which remains sealed electrically by the ALD layer material which lines or fully fills the "openings" in the PVD or CVD layer 112.

The embodiment of FIGS. 4A to 4E is thus also beneficial when the ALD layer has worn down to the free surface of the PVD or CVD layer because, although the corrosive substances can reach the free surface of the PVD or CVD or PECVD layer they still cannot reach the surface of the article itself.

Naturally, the PVD layer 112 of FIGS. 4D and 4E (in particular) still has a porous structure or a columnar structure with interstitial passages into which corrosive substances can penetrate. They cannot however reach the substrate because of the ALD layer (layer system) 114 which extends down to the actual surface of the article in such passages.

The PVD or CVD layer 112 can also comprise a layer system (not shown but comprising a plurality of different PVD and/or CVD layers or an alternating layer system or a superlattice structure) or a graded layer. Such layer structures are well known per se.

In this embodiment the ALD layer (layer system) 114" can—without restriction—be one of $Al_2O_3$, $SiO_2$, $TiO_2$, $Ta_2O_5$, $HfO_2$, mixed layers of any of the foregoing and multilayer structures of two or more of the foregoing The PVD or CVD layer 112, can—without restriction and without including a possible bond layer—comprise one of a DLC layer, a metal-DLC layer, or a layer of the same composition as the ALD layer. The PVD layer can for example also be an $Al_2O_3$ layer.

An apparatus for the deposition of ALD coatings will now be explained with reference to FIG. 5.

The treatment chamber 130 shown in FIG. 5 has a central at least substantially rectangular form when viewed from any of its sides. A chamber door not shown in FIG. 5 is pivotally connected to the front side of the chamber about vertical pivot axles, i.e. axles which lie parallel to the plane of the drawing. The rear side of the chamber could be connected by a load lock to a correspondingly designed opening at one side of the chamber 14 of FIG. 1 which is normally closed by a door located within the opening, that door of the chamber 14 may carry a magnetron and associated cathode. However, in practice such a load lock is not necessary, the treated articles from the chamber of FIGS. 1 and 2 can simply be transported in the normal ambient atmosphere to the chamber of FIG. 5. Also one chamber for applying a DLC coating, such as a chamber in accordance with FIGS. 1 and 2, could supply coated workpieces to a plurality of apparatuses for applying an ALD coating, such as apparatuses in accordance with FIG. 5.

The arrangement can be such that the workpiece table 20 of FIG. 1 together with the workpieces 12 can be to be transferred after deposition of the PVD coating 112 into the ALD chamber. If a load lock system is used this can be done without loss of vacuum and without contamination of the workpiece surface. The table 20 can rotate in the chamber 130 if desired but this is not essential. The transfer system is not shown but can be designed as in customary load lock systems. The apparatus could also be designed as a cluster system with a plurality of satellite ALD chambers such as 130 arranged around one chamber for depositing DLC coatings, such as is shown in FIGS. 1 and 2.

When the door and the load lock are closed the chamber 130 is closed on all sides. The door can be opened to permit access to the interior of the chamber and removal of the ALD coated workpieces on the table 20. The reference numeral 132 refers to a duct for the connection duct for a performance vacuum pump (not shown) such as a diffusion pump, a cryo pump or simply a mechanical pump which serves in known manner to generate the necessary vacuum in the treatment chamber. That vacuum may be of the order of 100 millitorr although it is certainly not necessary to go so low as there is a thermal space in the chamber of high temperature. The pressure can generally lie in a range from 1 to 1000 millitorr. Disposed opposite the vacuum connection duct 162 is a plasma generator 164 for generating a plasma from $O_2$ gas supplied to the chamber 130 via a valve system (not shown but including a flow regulator and an on/off valve) through port 166. The reference numeral 168 identifies an rf plasma generator basically comprising a coil 170 fed with a rf energy from source 172.

The reference numeral 174 refers to a source of inert gas such as argon which can be admitted to the chamber directly via the valve 176 during purging cycles and indirectly via the valve 178 and the container 180 when admitting $Al(CH_3)_3$ to the chamber 130 as a precursor for the deposition of $Al_2O_3$ layers by ALD. For this purpose a further valve or valve system 182 is present between the container 180 and the chamber 130 and can be controlled electronically (as can all other valves in the apparatus) to permit a predetermined quantity of $Al(CH_3)_3$ entrained by the flow of argon to enter the chamber 130 via port 184.

The plant of FIG. 5 can be operated as follows:

First of all, the atmosphere in the chamber 130 is evacuated via duct 162 and replaced by argon. This is done, in known manner, by operation of the vacuum pump and simultaneous supply of argon via valve 176 to flush the originally present residual air from the vacuum chamber 130. Chamber 130 is usually heated to between 200 and 400° C. by wall heaters.

The apparatus is then changed over to the oxygen admission cycle and a plasma is generated in the chamber by the rf-generator and the oxygen supplied thereto. Thereafter a predetermined quantity of $Al(CH_3)_3$ is added to the chamber for formation of the first $Al_2O_3$, layer by ALD. Thereafter the process is repeated until the desired number of ALD layers have been generated by the plasma enhanced ALD process. Once the final layer has been deposited by the ALD process, i.e. once the ALD layer (layer system) 114 has been completed the articles can now be removed from the chamber by opening the chamber doors.

It should be noted that the example of a cluster plant for carrying out the PVD and/or CVD process and the ALD process as described above is given purely by way of example and that the plant can take very different forms.

Since the ALD layer or layer system 114 is relatively thin and can be deposited relatively quickly in a time frame comparable to that required for depositing the layer 112 by PVD or CVD a cluster arrangement may not be the ideal layout.

The complete apparatus could for example be realized as a long tubular plant with successive stations for PVD deposition processes and/or CVD deposition processes and ALD deposition processes through which individual articles move. The entire tubular plant can be evacuated by the use of load locks for admitting articles to the plant and removing them from the plant without loss of vacuum. Local gas supplies to the individual stations and local vacuum pumps can also be provided to maintain desired atmospheres in the individual stations through which the articles sequentially move, for example on a conveyor belt. Such an arrangement can help minimize wastage of the gases required and enhance useful process time relative to non-profitable vacuum generation periods. However, it is probably easiest just to use two separate chambers one for depositing the DLC layer and one for depositing the ALD layers.

Some examples will now be given of advantageous layer systems which can be deposited in accordance with the present teaching with reference to FIGS. 6A to 6F.

Example 1

Figure 6A:
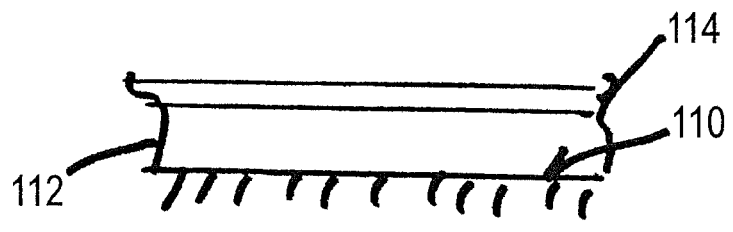

Turning first to FIG. 6A there can be seen a surface region 110 of an article in the form of a bearing race of 100Cr6 steel which is provided with a layer 112 of hydrogen free ta-C layer of 4 microns thickness. The layer 112 has a structure similar to that illustrated in FIG. 4D. On top of the layer 112 there is a layer 114 of $Al_2O_3$ of 10 nm thickness deposited by ALD using the apparatus of FIG. 5. In this case no bond layer is provided because the Cr content of the steel and the carbon of the ta-C layer are considered adequate.

Figure 6B:
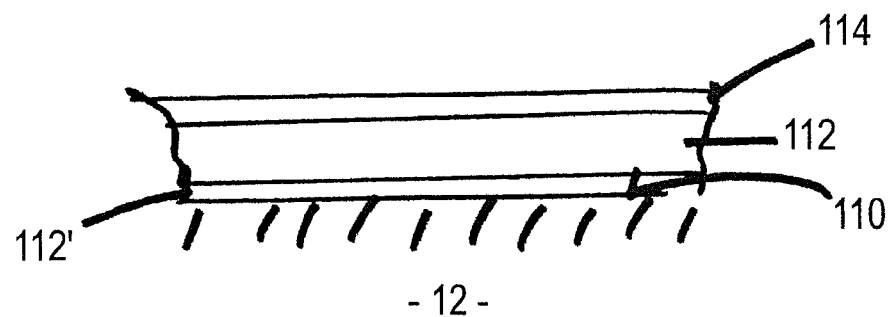

Example 2 (FIG. 6B)

This example is similar to Example 1 but has an a-C:H layer (a DLC layer) deposited as described in detail above on a thin bond layer 112' of chromium with a graded chromium carbide layer deposited using the apparatus of FIG. 1 as described above in detail or by using a chromium carbide target (cathode). The bond layer 112' is only relatively thin, and in this example is 10-300 nm thick.

Figure 6C:
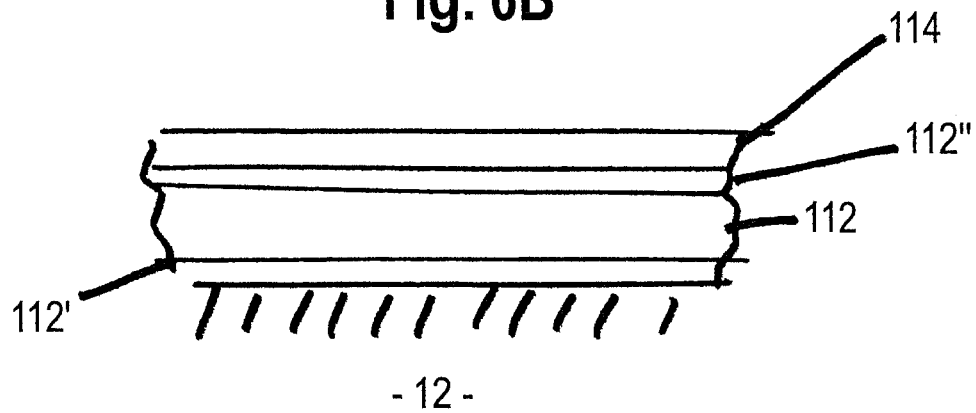

Example 3 (FIG. 6C)

In this example the coating is similar to the coating of Example 2 but includes an additional layer 112" of $Al_2O_3$ of 200 nm -2 μm thickness deposited by PVD in the apparatus of FIG. 1. For this purpose the apparatus of FIGS. 1 and 2 is modified so that it can carry out dual magnetron sputtering from two opposed magnetron cathodes of Al additionally provided in the vacuum chamber 14 for reactive sputtering using oxygen in the chamber atmosphere. The reactive sputtering of $Al_2O_3$ is described in detail in the European patent application published as EP-A-2076916. The apparatus can also be designed to make use of the combined use of HIPIMS and dual magnetron sputtering as described in the European patent application 11007077.8.

Figure 6D:
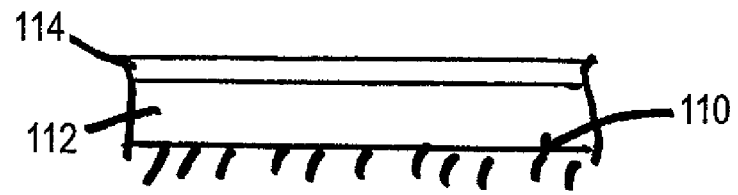

Example 4 (FIG. 6D)

In this example the layer structure is a two layer structure as shown in FIG. 6A but the layer 112 is an a-C:H layer of 1-4 microns thickness deposited by a CVD process (but not an ALD process). The ALD layer 114 of $Al_2O_3$ again has a thickness of 10 nm .

Figure 6E:

Example 5 (FIG. 6E)

This example is the same as Example 2 but the ALD layer 114 has a greater thickness of 26-50 nm .

Figure 6F:
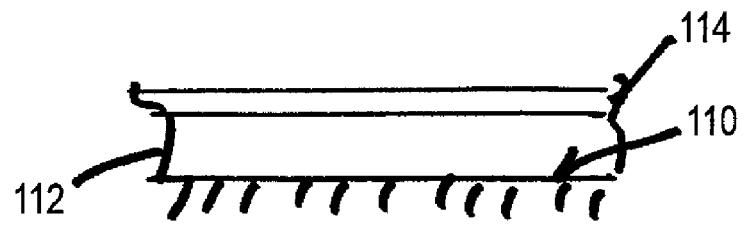

Example 6 (FIG. 6F)

This example is similar to Example 1, but here the layer 112 is a layer of $Al_2O_3$ 4 microns thick deposited by PVD (dual magnetron sputtering in a reactive oxygen atmosphere) as in Example 3.

Example 7

In this example the layer structure resembles that of Example 6 (FIG. 6E) but with a bond layer 112' of Cr or Ti deposited by PVD. It should be noted that it is unimportant whether the bond layer is electrically conducting or insulating since even if it is electrically conductive this situation is no worse than the component itself being electrically conductive.

In all examples the layers have the same thicknesses as in other examples unless something different is specifically stated. Thus the layer 112 is generally 1-4 microns thick. The layer 112", if present, is generally 50 nm -2.5 μm thick and the ALD layer 114 is generally 10-50 nm thick.

In all examples the thickness of the layers are 10nm for the layer 112', 4 microns for the layer 112, 10 nm for the layer 112" and 10 nm for the layer 114 unless otherwise stated. The electrical insulation and corrosion resistance of all examples was found to be good.

The invention claimed is:

1. A bearing component of steel, the bearing component having:
   at least one layer having a high hardness and a high current insulation property applied by at least one of a PVD (physical vapor deposition) process, a CVD (chemical vapor deposition) process, and a PECVD (plasma enhanced chemical vapor deposition) process (but excluding an ALD (atomic layer deposition) process or a plasma enhanced ALD process) at at least one surface region of said component, said at least one layer comprising a non-conductive oxide layer selected from the group of materials comprising an $Al_2O_3$ layer, a $Ta_xO_y$ layer, an $Si_xO_y$ layer, a mixed layer comprising two or more of the foregoing oxides, a multilayer structure comprising alternating layers of two or more of the foregoing oxides and a DLC (diamond-like carbon) layer; and
   at least one ALD layer comprising at least one layer of a material deposited by an ALD process on said at least one layer having a high hardness and a high current insulation property, the ALD layer itself having a high current insulation property and comprising a material or layer structure selected from the group of materials comprising an $Al_2O_3$ layer, a $Ta_xO_y$ layer, an $Si_xO_y$ layer, a $TiO_2$ layer, an $HfO_2$ layer, a mixed layer comprising two or more of the foregoing oxides, and a multilayer structure comprising alternating layer of two or more of the foregoing oxides.

2. A bearing component in accordance with claim 1, the bearing component being selected from the group comprising a component of a linear bearing, a component of a rolling element bearing and a component of a sliding bearing.

3. A bearing component in accordance with claim 1, the component being selected from the group comprising a bearing race, a rolling element a tapered roller, a barrel roller, a needle roller, a bearing ball and a rolling element cage.

4. A bearing component in accordance with claim 1, wherein the at least one layer applied by at least one of a PVD (physical vapor deposition) process, a CVD (chemical vapor deposition) process, and a PECVD (plasma enhanced chemical vapor deposition) process (but excluding an ALD process or a plasma enhanced ALD process) has a composition and that composition is at least substantially the same as a composition of the layer deposited by the ALD process.

5. A bearing component in accordance with claim 1, wherein the said at least one layer applied by at least one of a PVD (physical vapor deposition) process, a CVD (chemical vapor deposition) process, and a PECVD (plasma enhanced chemical vapor deposition) process (but excluding an ALD process or a plasma enhanced ALD process) has a thickness in the range from 0.5 microns to 4 microns and the ALD layer has a thickness in the range from 1 nm to 1000 nm.

6. A bearing component in accordance with claim 5, wherein the thickness of the ALD layer is in the range from 10 to 50 nm.

7. A bearing component in accordance with claim 1, wherein the steel of which the article is made is a martensitic grade of steel.

8. A bearing component in accordance with claim 7, wherein the martensitic grade of steel is at least one of a bearing steel and a coldworkable steel.

9. A bearing component in accordance with claim 7 wherein the martensitic grade of steel is one of 100Cr6, 100CrMn6, 16MnCr5, or X30CrMoN 15 1, and a steel in accordance with Din: 1.4108 or SAE: AMS5898.

10. A bearing component in accordance with claim 1, wherein the at least one layer having a high hardness and a high current insulation property applied by at least one of a PVD (physical vapor deposition) process, a CVD (chemical vapor deposition) process, and a PECVD (plasma enhanced chemical vapor deposition) process (but excluding an ALD process or a plasma enhanced ALD process) is provided with an additional PVD layer deposited by one of arc sputterin,), magnetron sputtering, reactive magnetron sputtering and dual magnetron sputtering, any of the foregoing optionally with plasma enhancement prior to the deposition of the ALD layer.

11. A bearing component in accordance with claim 10, wherein the arc sputtering is carried out by filtered arc sputtering using at least one rectangular or round sources and the laser arc deposition is carried out using at least one cylindrical source and the magnetron sputtering is carried out using at least one of a rectangular sources, a round source, a cylindrical source and first and second opposed magnetron sources.

12. A bearing comprising a bearing component of steel, the bearing component having:
   at least one layer having a high hardness and a high current insulation property applied by at least one of a PVD (physical vapor deposition) process, a CVD (chemical vapor deposition) process, and a PECVD (plasma enhanced chemical vapor deposition) process (but excluding an ALD (atomic layer deposition) process or a plasma enhanced ALD process) at at least one surface region of said component, said at least one layer comprising a non-conductive oxide layer selected from the group of materials comprising an Al2O3 layer, a TaxOy layer, an SixOy layer, a mixed layer comprising two or more of the foregoing oxides, a multilayer structure comprising alternating layers of two or more of the foregoing oxides and a DLC (diamond-like carbon) layer; and
   at least one ALD layer comprising at least one layer of a material deposited by an ALD process on said at least one layer having a high hardness and a high current insulation property, the ALD layer itself having a high current insulation property and comprising a material or layer structure selected from the group of materials comprising an $Al_2O_3$ layer a $Ta_xO_y$ layer, an $Si_xO_y$ layer, a $TiO_2$ layer, an $HfO_2$ layer, a mixed layer comprising two or more of the foregoing oxides, and a multilayer structure comprising alternating layers of two or more of the foregoing oxides.

13. A machine comprising a bearing component of steel, the bearing component having:
   at least one layer having a high hardness and a high current insulation property applied by at least one of a PVD (physical vapor deposition) process, a CVD (chemical vapor deposition) process, and a PECVD (plasma enhanced chemical vapor deposition) process (but excluding an ALD (atomic layer deposition) process or a plasma enhanced ALD process) at at least one surface region of said component, said at least one layer comprising a non-conductive oxide layer selected from the group of materials comprising an $Al_2O_3$ layer, a $Ta_xO_y$ layer, an $Si_xO_y$ layer, a mixed layer comprising two or more of the foregoing oxides, a multilayer structure comprising alternating layers of two or more of the foregoing oxides and a DLC (diamond-like carbon) layer; and at least one ALD layer comprising at least one layer of a material deposited by an ALD process on said at least one layer having a high hardness and a high current insulation property, the ALD layer itself having a high current insulation property and comprising a material or layer structure selected from the group of materials comprising an $Al_2O_3$ layer, a $Ta_xO_y$ layer, an $Si_xO_y$ layer, a $TiO_2$ layer, an $HfO_2$ layer, a mixed layer comprising two or more of the foregoing oxides, and a multilayer structure comprising alternating layer of two or more the foregoing oxides.

* * * * *